(12) United States Patent
Futatsuyama et al.

(10) Patent No.: US 8,289,800 B2
(45) Date of Patent: Oct. 16, 2012

(54) NONVOLATILE SEMICONDUCTOR MEMORY DEVICE

(75) Inventors: Takuya Futatsuyama, Yokohama (JP); Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 12/693,824

(22) Filed: Jan. 26, 2010

(65) Prior Publication Data
US 2010/0188920 A1  Jul. 29, 2010

(30) Foreign Application Priority Data
Jan. 27, 2009 (JP) ................. 2009-015782

(51) Int. Cl.
*G11C 5/14* (2006.01)
(52) U.S. Cl. ......... 365/227; 365/226; 365/228; 365/229
(58) Field of Classification Search ............... 365/226, 365/227, 228, 229
See application file for complete search history.

(56) References Cited

U.S. PATENT DOCUMENTS

| | | | |
|---|---|---|---|
| 5,877,985 A | | 3/1999 | Banba et al. |
| 6,021,082 A * | | 2/2000 | Shirai ........................... 365/226 |
| 6,335,895 B1 * | | 1/2002 | Sugibayashi ................. 365/227 |
| 6,392,394 B1 * | | 5/2002 | Nakagawa et al. ........... 323/315 |
| 6,661,279 B2 | | 12/2003 | Yabe |
| 6,791,894 B2 * | | 9/2004 | Nagai et al. .................. 365/226 |
| 6,803,908 B2 * | | 10/2004 | Fujise et al. .................. 345/205 |
| 6,822,921 B2 * | | 11/2004 | Otsuka ......................... 365/226 |
| 6,909,320 B2 * | | 6/2005 | Chan et al. ................... 327/541 |
| 6,930,948 B2 * | | 8/2005 | Lee et al. ..................... 365/226 |
| 6,985,027 B2 | | 1/2006 | Yabe |
| 7,068,547 B2 * | | 6/2006 | Do .......................... 365/189.11 |
| 7,248,533 B2 * | | 7/2007 | Aimoto ........................ 365/227 |
| 7,257,720 B2 * | | 8/2007 | Ichien et al. ................. 713/300 |
| 7,795,953 B2 * | | 9/2010 | Ogiwara et al. ............. 327/541 |
| 7,835,199 B2 * | | 11/2010 | Choi et al. ............... 365/189.09 |

FOREIGN PATENT DOCUMENTS

| | | |
|---|---|---|
| JP | 10-11987 | 1/1998 |
| JP | 2002-83494 | 3/2002 |
| JP | 2002-373942 | 12/2002 |

* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

A nonvolatile semiconductor memory device has an internal step-down power generation circuit and a memory circuit. The internal step-down power generation circuit generates a first internal power supply voltage from an external power supply voltage in an active state, and generates a second internal power supply voltage different from the first internal power supply voltage from the external power supply voltage in a standby state. The memory circuit includes a cell array containing a nonvolatile memory cell and a sense amplifier detecting data read from the cell array. The sense amplifier is supplied with a voltage generated by the internal step-down power generation circuit as an internal power supply voltage.

21 Claims, 7 Drawing Sheets

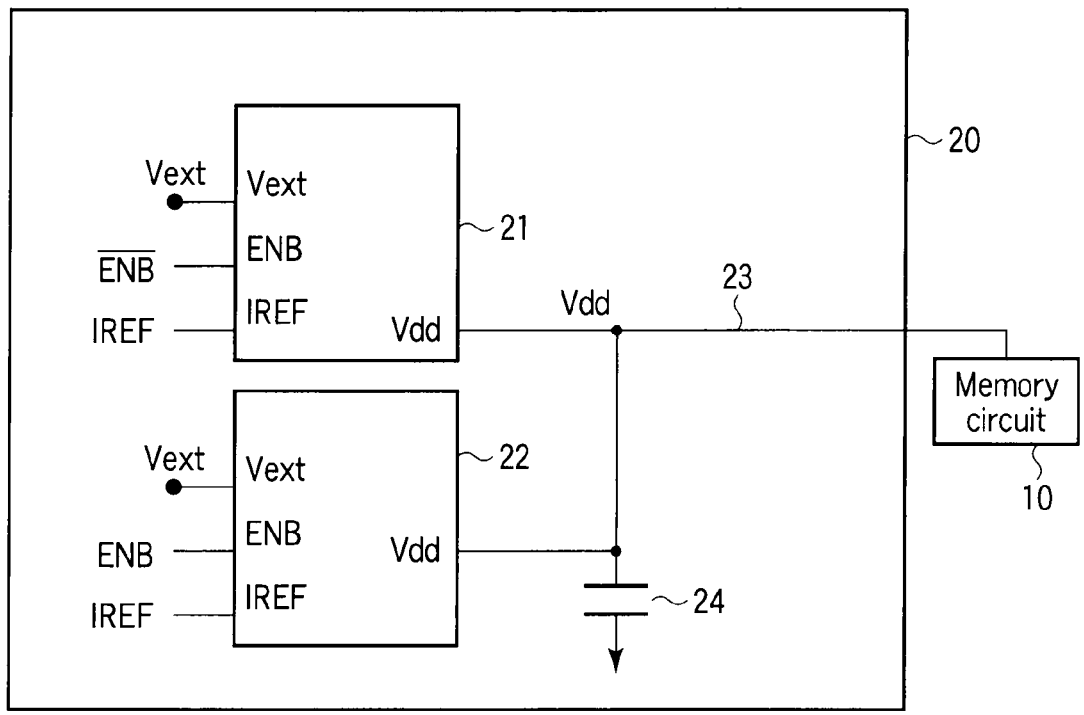
F I G. 1
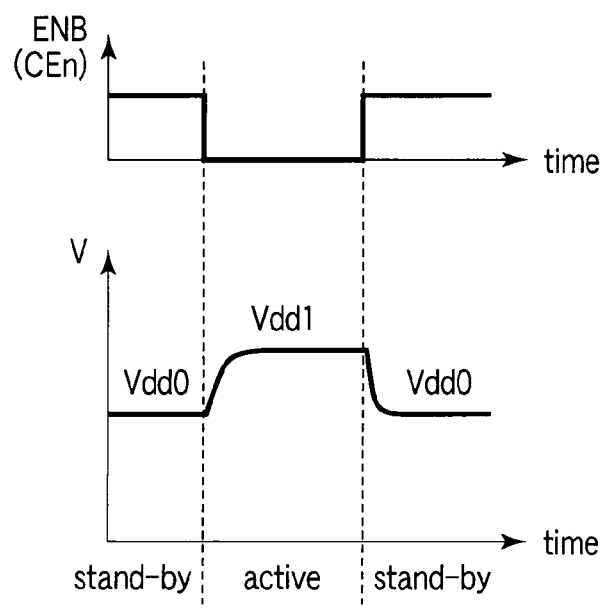
F I G. 3

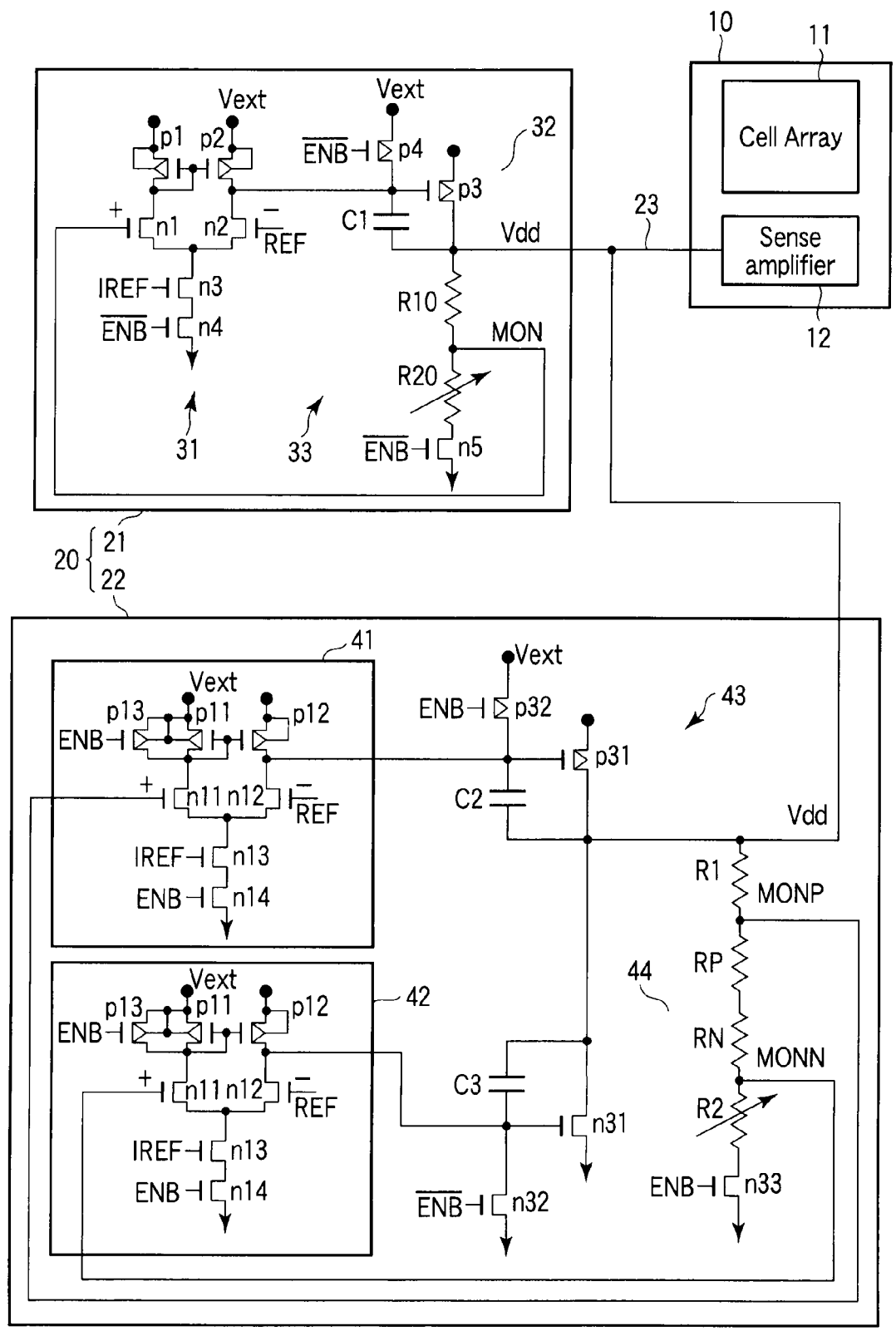
F I G. 2

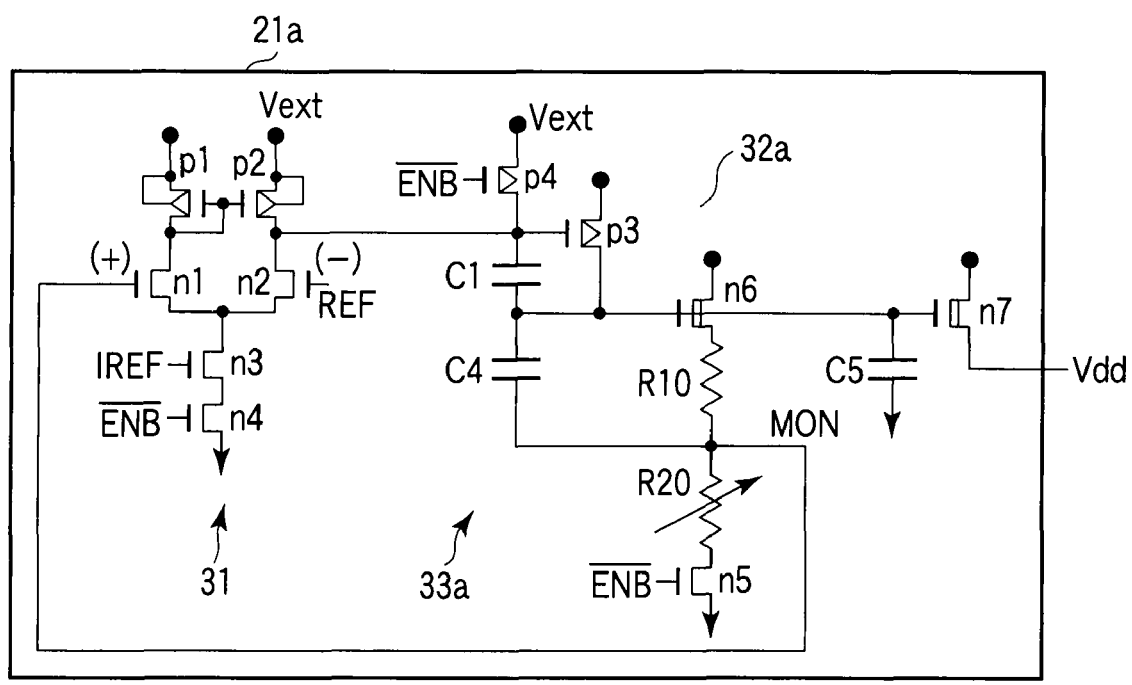
F I G. 4

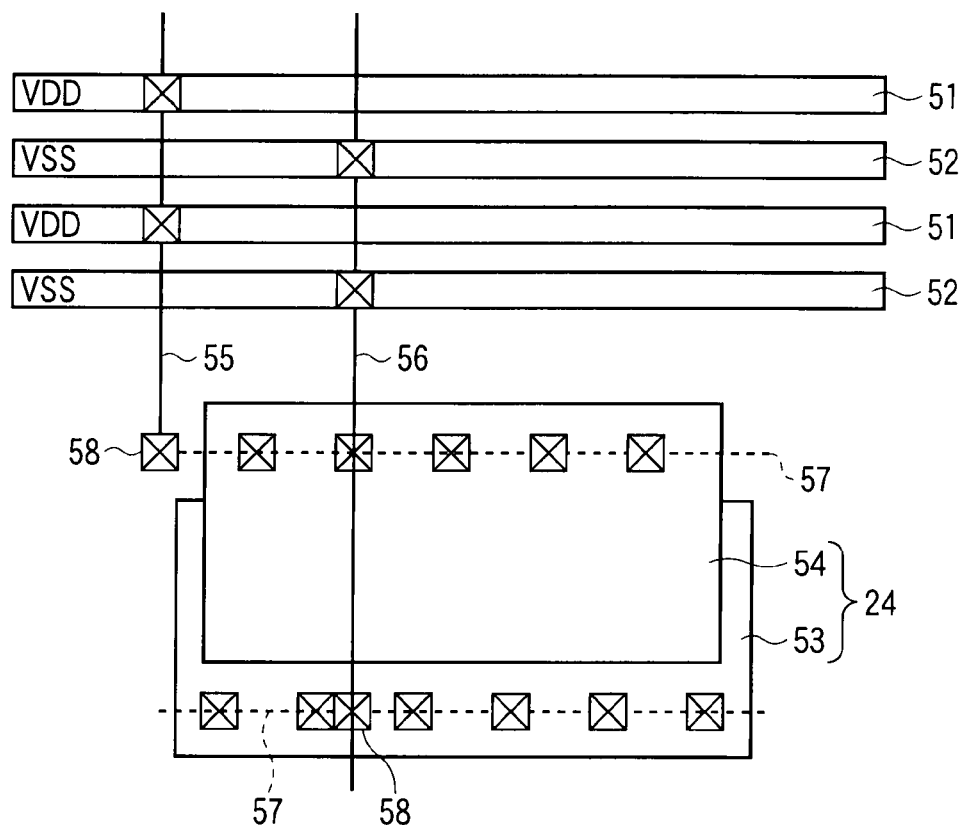
F I G. 6
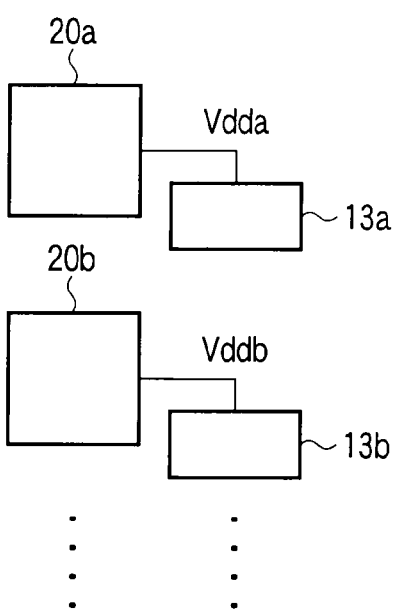
F I G. 5
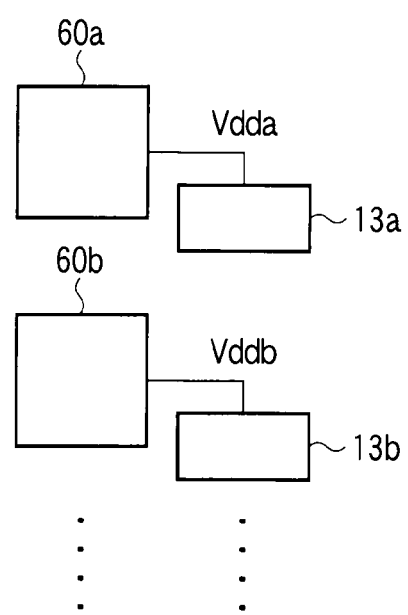
F I G. 9

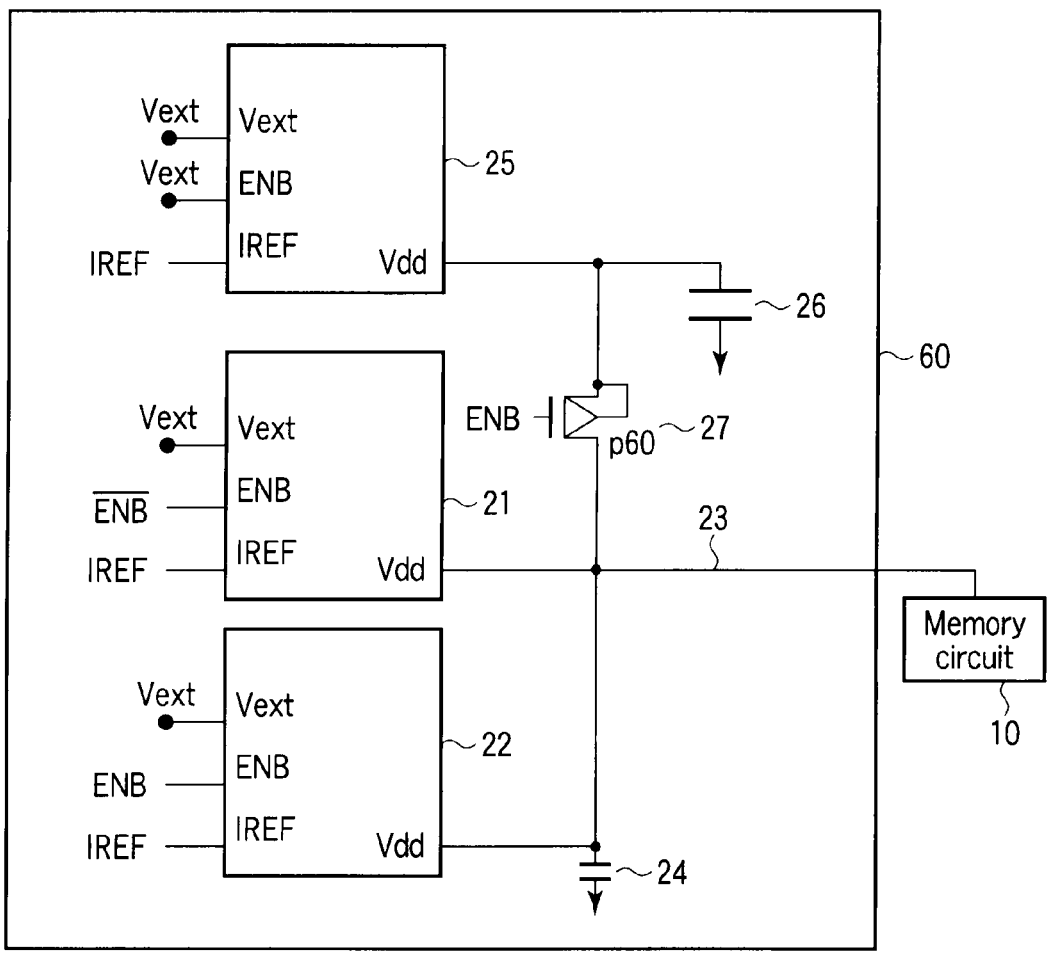
F I G. 7
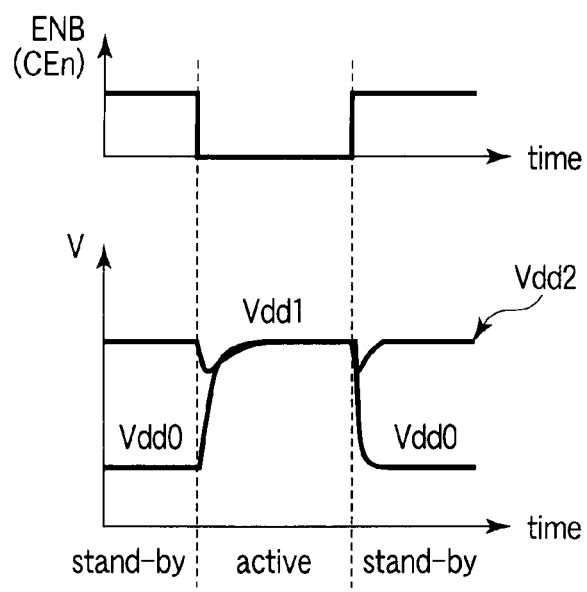
F I G. 8

NONVOLATILE SEMICONDUCTOR MEMORY DEVICE

CROSS-REFERENCE TO RELATED APPLICATIONS

This application is based upon and claims the benefit of priority from prior Japanese Patent Application No. 2009-015782, filed Jan. 27, 2009, the entire contents of which are incorporated herein by reference.

BACKGROUND OF THE INVENTION

1. Field of the Invention

The present invention relates to a nonvolatile semiconductor memory device; in particular to a NAND flash memory using an internal power supply voltage lower than an external power supply voltage. More particularly, the present invention relates to a nonvolatile semiconductor memory device, which is built in a low-power consumption mobile phone, in particular.

2. Description of the Related Art

A nonvolatile semiconductor memory device, for example, a NAND flash memory has a need to meet the requirements of a mass capacity with a scale reduction of a design rule. For this reason, a block size, a page size or the number of planes increases. In particular, the page size or the number of planes increase, and thereby, the number of sense amplifiers for detecting data of a bit line increases. In order to keep the layout pattern of a sense amplifier to a predetermined bit line pitch, there is a need to make the layout area of a sense amplifier circuit as small as possible. For this reason, there is a tendency for the gate width of a transistor used for the sense amplifier circuit to be reduced.

Usually, if the gate width of transistor is reduced, a phenomenon such that a threshold voltage becomes high (narrow channel effect) occurs. However, the following problem arises in the case of employing an insulating film for an isolation insulating film between transistors, a gate insulating film or intergate insulating film of a memory cell transistor peculiar to a flash memory or a charge storage layer of the memory cell transistor. Namely, the process of forming the foregoing insulating film is carried out, and thereby, leak current flows through a channel edge of a transistor. As a result, the threshold voltage of transistor is reduced; therefore, the cutoff current (Ioff) of nMOS and pMOS transistors increases. The standby current of a memory is the total sum of the cutoff current of transistor and a current of a circuit through which a steady-state current flows. For this reason, when the cutoff current increases, a current (standby current) of a memory in a standby state increases.

According to a normal physical model, if the gate width of a MOS transistor is reduced, the threshold voltage of transistor increases by narrow channel effect while the cutoff current decreases.

However, there is the following case depending on a material for processing an isolation insulating film between transistors, that is, shallow trench isolation (STI). Namely, if the gate width of transistor is reduced, the threshold voltage of transistor is reduced while the cutoff current increases. The following example is given as one of the foregoing physical model. Specifically, if positive fixed charges (+) are generated in an isolation region depending on the material of the isolation region, negative charges (−) are induced along the channel length direction of an nMOS transistor. As a result, even if the nMOS transistor is in a cutoff state, a region where much leak current flows through channel both edges occurs. The gate width of transistor becomes narrow, and thereby, a ratio occupied by the foregoing region where much leak current flows through channel both edges becomes high; for this reason, the cutoff current increases. Therefore, it is not expected to reduce the cutoff current by a reduction of the gate width of transistor. In fact, a degree that the cutoff current increases becomes high, and the leak current increases beyond narrow channel effect; as a result, the reduction of the gate width is a factor of causing a tendency for the cutoff current to increase.

As described above, in the NAND flash memory, the number of bit-line sense amplifier circuits increases with a scale reduction of a design rule. Further, if the gate width of transistor used for a sense amplifier is reduced, and thereby, the cutoff current increases, there is the possibility that a standby current increases. As a result, there is the possibility that the lifetime of a battery becomes short in mobile electronic apparatuses such as a mobile phone and a mobile music player having a built-in NAND flash memory.

In particular, in a NAND flash memory of a 70 nm-after process generation design rule, the cutoff current of an nMOS transistor in the standby current largely depends on the nMOS transistor in a sense amplifier. For this reason, it is important to reduce the cutoff current of the nMOS transistor in the sense amplifier.

Jpn. Pat. Appln. KOKAI Publication No. 2002-373942 discloses the following SRAM. The SRAM includes an operation power step-down circuit and a standby power step-down circuit, which generate operation internal power and standby internal power, respectively. Further, each output node is connected to an internal power source line. In this case, the foregoing two power step-down circuits each include a reference voltage generation circuit, which generates a reference voltage different from each other. The operation power step-down circuit outputs a first internal power supply voltage lower than an external power supply voltage in a normal operation using a first reference voltage generated by a first reference voltage generation circuit. Further, the circuit is controlled so that it is in an output off state in a standby time. The standby power step-down circuit always outputs a second internal power supply voltage lower than the first internal power supply voltage to an internal power source line using a second reference voltage generated by a second reference voltage generation circuit.

BRIEF SUMMARY OF THE INVENTION

According to a first aspect of the present invention, there is provided a nonvolatile semiconductor memory device comprising:

at least one internal step-down power generation circuit configured to generate a first internal power supply voltage from an external power supply voltage in an active state, and generate a second internal power supply voltage different from the first internal power supply voltage from the external power supply voltage in a standby state; and a memory circuit including a cell array containing a nonvolatile memory cell and a sense amplifier detecting data read from the cell array, and supplied with a voltage generated by the at least one internal step-down power generation circuit as an internal power supply voltage.

According to a second aspect of the present invention, there is provided a nonvolatile semiconductor memory device comprising:

at least one internal step-down power generation circuit configured to generate a first internal power supply voltage from an external power supply voltage in an active state, and generate a second internal power supply voltage different from the first internal power supply voltage from the external power supply voltage in a standby state; and a memory circuit including a cell array containing a nonvolatile memory cell and a sense amplifier detecting data read from the cell array, and supplied with a voltage generated by the at least one internal step-down power generation circuit as an internal power supply voltage, wherein the at least internal step-down power generation circuit includes:

a first power step-down circuit having a first output node, and generating the first internal power supply voltage from an external power supply voltage in the first output node in an active state;

a second power step-down circuit having a second output node connected to the first output node, and generating the second internal power supply voltage from an external power supply voltage in the second output node in a standby state;

a third power step-down circuit having a third output node, and always outputting a third internal power supply voltage from an external power supply voltage in the third output node;

a first capacitor connected to the third output node; and a switch circuit connected between the first and second output nodes and the third output node, and being conductive for a period of the active state while being non-conductive for a period of the standby state.

BRIEF DESCRIPTION OF THE SEVERAL VIEWS OF THE DRAWING

FIG. 1 is a block diagram showing the internal configuration of a chip of a NAND flash memory according to a first embodiment of the present invention;

FIG. 2 is a circuit diagram showing the detailed configuration of a circuit shown in FIG. 1;

FIG. 3 is a waveform chart to explain one example of the operation of a circuit shown in FIG. 2;

FIG. 4 is a circuit diagram showing a modification example of a first power step-down circuit shown in FIG. 2;

FIG. 5 is a block diagram showing the internal configuration of a chip of a NAND flash memory according to a modification example of the first embodiment of the present invention;

FIG. 6 is a top plan view showing a layout image of an interconnect line and a capacitor used for a circuit shown in FIG. 5;

FIG. 7 is a block diagram showing the internal configuration of a chip of a NAND flash memory according to a second embodiment of the present invention;

FIG. 8 is a waveform chart to explain one example of the operation of a circuit shown in FIG. 7;

FIG. 9 is a block diagram showing the internal configuration of a chip of a NAND flash memory according to a modification example of the second embodiment of the present invention;

DETAILED DESCRIPTION OF THE INVENTION

Figure 10:
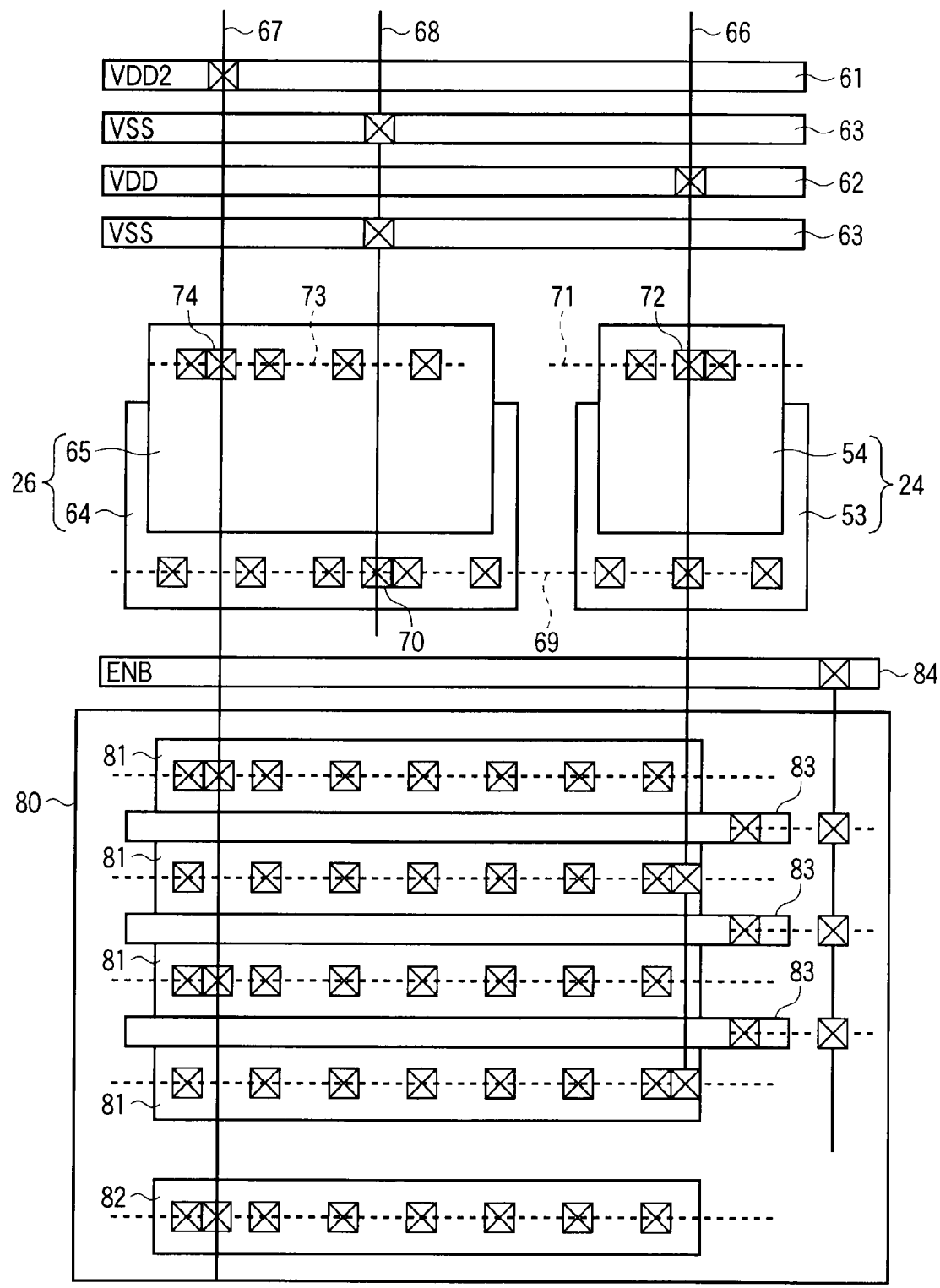
FIG. 10 is a top plan view showing a layout image of an interconnect line, a capacitor and a pMOS transistor forming a switch circuit used for a circuit shown in FIG. 9.

Various embodiments of the present invention will be hereinafter described with reference to the accompanying drawings. In the following description, the same reference numerals are used to designate portions common to all drawings.

<First Embodiment>

FIG. 1 is a block diagram showing the internal configuration of a chip of a NAND flash memory according to a first embodiment of the present invention. A memory chip of the foregoing NAND flash memory employs an nMOS transistor and a pMOS transistor, which are formed according to a 70 nm-or less design rule, and isolated by an isolation region having a trench structure. The foregoing memory chip is formed with a memory circuit 10, a high-voltage generation circuit and an internal step-down power generation circuit 20.

The internal step-down power generation circuit 20 generates an internal power supply voltage Vdd stepping down an external power supply voltage Vext, and then, supplies the voltage Vdd to the memory circuit 10. The internal step-down power generation circuit 20 includes first and second power step-down circuit 21 and 22. Specifically, the first power step-down circuit 21 outputs a first internal power supply voltage when a memory chip is in an active state. The second power step-down circuit 22 outputs a second internal power supply voltage lower than the first internal power supply voltage when the memory chip is in a standby state. Each output node of first and second power step-down circuits 21 and 22 is connected in common to an internal power line 23. The internal power line 23 is connected with a capacitor 24 as the necessity arises.

As shown in FIG. 2, the memory circuit 10 includes a cell array 11, a bit line sense amplifier 12 for detecting data from the cell array 11, a row decoder and a column decoder. The cell array 11 has a plurality of NAND memory cell columns arrayed. Each NAND memory cell column includes a plurality of series-connected nonvolatile memory cells and two select transistors connected to one and the other terminals of the column. The high-voltage generation circuit generates a high voltage stepping up an external power supply voltage Vext, and then, supplies the generated voltage to the row decoder of the memory circuit 10. According to this embodiment, an internal power supply voltage Vdd generated by the internal step-down power generation circuit 20 is supplied to the bit line sense amplifier 12 in the memory circuit 10.

According to this embodiment, the active state means a state that the memory circuit 10 executes a normal circuit operation. The standby state means a state that the memory circuit 10 waits for the next normal operation without executing the circuit operation. The active state and the standby state of a memory chip are usually controlled according to a chip enable signal (CEn) applied to a control pin of an external input terminal of the memory chip.

An internal power supply voltage Vdd is supplied from the internal power line 23 to which each output node of first and second power step-down circuits 21 and 22 are connected in common, to the memory circuit 10.

The first power step-down circuit 21 includes a differential amplifier circuit 31, an output buffer circuit 32 and a voltage division circuit 33. Specifically, the differential amplifier circuit 31 is supplied with an external power supply voltage Vext from a Vext node. The output buffer circuit 32 is connected to the output side of the differential amplifier circuit 31.

The differential amplifier circuit 31 includes nMOS input transistors n1, n2 forming a differential couple, a pair of current mirror-connected pMOS load transistors p1, p2, a reference current source nMOS transistor n3 and an activation control nMOS transistor n4. In this case, the reference current source nMOS transistor n3 is connected between source common connection nodes of nMOS input transistors n1, n2 and a ground node. A non-inverted input terminal (+) of the differential amplifier circuit 31, that is, the gate terminal of the nMOS transistor n1 is supplied with a monitor voltage MON generated by the voltage division circuit 33. An inverted input terminal (−) of the differential amplifier circuit 31, that is, the gate terminal of the nMOS transistor n2 is supplied with a reference voltage REF. The gate terminal of the reference current source nMOS transistor n3 is supplied with a reference voltage IREF. The gate terminal of the activation control nMOS transistor n4 is supplied with an activation control signal /ENB.

The output buffer circuit 32 includes a pMOS transistor p3, a pMOS transistor p4 and a capacitor C1. Specifically, the pMOS transistor p3 has a source terminal supplied with an external power supply voltage Vext of the Vext node, a gate terminal connected to the output node of the differential amplifier circuit 31 and a drain terminal connected to a Vdd output node. The pMOS transistor p4 has a source terminal supplied with an external power supply voltage Vext of the Vext node, a drain terminal connected to the gate terminal of the pMOS transistor p3 and a gate terminal supplied with the activation control signal /ENB. The capacitor C1 is connected between the gate terminal of the pMOS transistor p3 and the drain terminal thereof.

The voltage division circuit 33 includes a first resistance element R10, a second resistance element R20 and an activation control nMOS transistor n5. The first resistance element R10, the second resistance element R20 and the source/drain path of the activation control nMOS transistor n5 are connected in series between the drain terminal of the pMOS transistor p3 (connected with the internal power line 23) and a ground node. The gate terminal of the nMOS transistor n5 is supplied with the activation control signal /ENB. A voltage of a series-connected node of the foregoing resistance elements R10 and R20 is fed back to the non-inverted input terminal of the differential amplifier circuit 31 as the monitor voltage MON.

The second power step-down circuit 22 includes first and second differential amplifier circuits 41 and 42 supplied with an external power supply voltage Vext from a Vext node, a push-pull output buffer circuit 43 and a voltage division circuit 44.

The first differential amplifier circuit 41 includes nMOS input transistors n11, n12 forming a differential couple, a pair of current mirror-connected pMOS load transistors p11, p12, a reference current source nMOS transistor n13, an activation control nMOS transistor n14, and an activation control pMOS transistor p13. In this case, the reference current source nMOS transistor n13 is connected between source common connection nodes of nMOS input transistors n11, n12 and a ground node. The activation control pMOS transistor p13 is connected in parallel to one pMOS transistor p11 of the paired pMOS load transistors. A non-inverted input terminal of the first differential amplifier circuit 41, that is, the gate terminal of the nMOS transistor n11 is supplied with a first monitor voltage MONP. An inverted terminal, that is, the gate terminal of the nMOS transistor n12 is supplied with a reference voltage REF. The gate terminal of the reference current source nMOS transistor n13 is supplied with a reference voltage IREF. Each gate terminal of activation control nMOS transistors n14 and pMOS transistor p13 is supplied with an activation control signal ENB.

Like the foregoing first differential amplifier circuit 41, the second differential amplifier circuit 42 includes nMOS input transistors n11, n12 forming a differential couple, a pair of current mirror-connected pMOS load transistors p11, p12, a reference current source nMOS transistor n13, an activation control nMOS transistor n14, and an activation control pMOS transistor p13. In this case, the reference current source nMOS transistor n13 is connected between source common connection nodes of nMOS input transistors n11, n12 forming a differential couple and a ground node. The activation control pMOS transistor p13 is connected in parallel to one pMOS transistor p11 of the paired pMOS load transistors. A non-inverted input terminal of the second differential amplifier circuit 42, that is, the gate terminal of the nMOS transistor n11 is supplied with a second monitor voltage MONN. An inverted terminal, that is, the gate terminal of the nMOS transistor n12 is supplied with the reference voltage REF. The gate terminal of the reference current source nMOS transistor n13 is supplied with the reference voltage IREF. Each gate terminal of activation control nMOS transistors n14 and pMOS transistor p13 is supplied with the activation control signal ENB.

The push-pull output buffer circuit 43 includes a pMOS transistor p31, a pMOS transistor p32, a capacitor C2, an nMOS transistor n31, an nMOS transistor n32 and a capacitor C3. Specifically, the pMOS transistor p31 has a source terminal supplied with an external power supply voltage Vext of a Vext node, a gate terminal connected to an output node of the first differential amplifier circuit 41 and a drain terminal connected to an output node of Vdd. The pMOS transistor p32 has a source terminal supplied with an external power supply voltage Vext of a Vext node, a drain terminal connected to the gate terminal of the pMOS transistor p31 and a gate terminal supplied with the activation control signal ENB. The capacitor C2 is connected between the gate terminal of the pMOS transistor p31 and the drain terminal thereof. The nMOS transistor n31 has a drain terminal connected to the output node of Vdd, a source terminal connected to the ground node and a gate terminal connected to an output node of the second differential amplifier circuit 42. The nMOS transistor n32 has a source terminal connected to a ground node, a drain terminal connected to the gate terminal of the nMOS transistor n31 and a gate terminal supplied with the activation control signal /ENB. The capacitor C3 is connected between the gate terminal of the nMOS transistor n31 and the drain terminal thereof.

The voltage division circuit 44 includes a first resistance element R1, a second resistance element RP, a third resistance element RN, a fourth resistance element R2 and an activation control nMOS transistor n33. The first to fourth resistance elements R1, RP, RN, R2 and a source/drain path of the nMOS transistor n33 are connected in series between the drain terminal of the pMOS transistor p31 (connected with an internal power line 23) and a ground node. The gate terminal of nMOS transistor n33 is supplied with the activation control signal ENB. A voltage of series-connected resistance elements R1 and RP is fed back to the non-inverted input terminal of the first differential amplifier circuit 41 as the first monitor voltage MONP. A voltage of series-connected resistance elements RN and R2 is fed back to the non-inverted input terminal of the second differential amplifier circuit 42 as the second monitor voltage MONN. The foregoing activation control signals ENB and /ENB are mainly controlled based on a chip enable signal CEn.

The operation of the circuit shown in FIG. 1 will be described below. According to this embodiment, the following control is carried out. Specifically, when the memory chip is in an active state, a standby control activation control signal ENB is set to a level "L" while a signal /ENB is set to a level "H". When the memory chip is in a standby state, the signal ENB is set to a level "H" while the signal /ENB is set to a level "L".

When the memory chip is an active state (ENB is a level "L" while /ENB is a level "H"), in the first power step-down circuit 21, nMOS transistors n4 and n5 turn on while pMOS transistor p4 turns off. In this way, the pMOS transistor p3 turns on so that a current flows through resistance elements R10 and R20. The first power step-down circuit 21 generates an internal power supply voltage Vdd stepping down an external power supply voltage Vext, and thereafter, supplies the voltage Vdd to the memory circuit 10 from the drain terminal of the pMOS transistor p3 via the internal power line 23. In this active state, each resistance of resistors R10 and R20 are controlled so that the relation of Vdd1=(1+R10/R20)×REF is obtained. In this way, the voltage Vdd is fed back so that it matches with a target voltage Vdd1.

On the contrary, in the second power step-down circuit 22, when the memory chip is in an active state, transistors p13, p32 and n32 turn on while transistors n14 and n33 turn off. In this way, transistors p31 and n31 turn off so that a current does not flow through resistance elements R10, RP, RN and R2. Therefore, the output operation of the second power step-down circuit 22 is stopped, and thus, the circuit 22 does not supply an internal power supply voltage Vdd to the internal power line 23.

On the other hand, when the memory circuit is in a standby state (ENB is a level "H" while /ENB is a level "L"), in the first power step-down circuit 21, nMOS transistors n4 and n5 turn off while pMOS transistor p4 turns on. In this way, the pMOS transistor p3 turns off so that a current does not flows through resistance elements R10 and R20. Therefore, the output operation of the first power step-down circuit 21 is stopped, and thus, the circuit 22 does not supply an internal power supply voltage Vdd to the internal power line 23.

On the contrary, in the second power step-down circuit 22, when the memory chip is in a standby state, transistors p13, p32 and n32 turn off while transistors n14 and n33 turn on. In this way, transistors p31 and n31 turn on and a current flows through resistance elements R10, RP, RN and R2. The second power step-down circuit 22 generates an internal power supply voltage Vdd stepping down an external power supply voltage Vext, and thereafter, supplies the voltage Vdd to the memory circuit 10 from the common drain terminal of pMOS transistor p31 and nMOS transistor n31 via the internal power line 23. In this standby state, each resistance of resistors R1, Rp, RN0 and R2 are controlled so that the relation of REF=Vdd/{(1+(R1+RP)/(RN+R2)} is obtained. In this way, the voltage Vdd is fed back so that it matches with a target voltage Vdd0={1+(R1+RP)/(RN+R2)}×REF is obtained.

In a standby sate, if a voltage Vdd output to the internal power line 23 becomes lower than a voltage Vdd0−α2 (α2 is an arbitrary value), that is, the relation of Vdd<(1+R1/(RP+RN+R2)×REF={(RN+R2)/(RP+RN+R2)}×Vdd0 is established. In this case, the gate voltage of the pMOS transistor p31 steps down based on the output voltage of the first differential amplifier circuit 41, and then, the pMOS transistor p31 charges an output node of Vdd so that the voltage of the node of Vdd is stepped up. On the contrary, if a voltage Vdd output to the internal power line 23 becomes higher than a voltage Vdd0+α1 (α1 is an arbitrary value), that is, the relation of Vdd>(1+R1+RP+RN/RP)×REF={(RN+R2)/RP}×Vdd0 is established. In this case, the gate voltage of the nMOS transistor n31 steps up based on the output voltage of the second differential amplifier circuit 42, and then, the nMOS transistor n31 discharges an output node of Vdd so that the voltage of the node of Vdd is stepped down. As described above, when the memory chip is in a standby state, the voltage Vdd is controlled with respect to the voltage Vdd0 so that the relation of {(RN+R2)/RP}×Vdd0<Vdd<{(RN+R2)/(RP+RN+R2)}×Vdd0 is established.

FIG. 3 is a view showing the activation control signal ENB and a voltage waveform of the output node of the internal power supply voltage Vdd in the circuit shown in FIG. 2. In a standby state, a voltage Vdd0 is output from the second power step-down circuit 22 while in an active state, a voltage Vdd1 is output from the first power step-down circuit 21. The Vdd1 is higher than the voltage Vdd0. Namely, when the memory chip is in a standby state, the second power step-down circuit 22 outputs a voltage lower than the output of the first power step-down circuit 21. In a standby state, the voltage Vdd is stepped down, and thereby, a gate leak current of transistors of the sense amplifier 12 in the memory circuit 10 rapidly decreases. In this case, it is not advantageous that the value of Voltage Vdd0 is lower. If the voltage Vdd0 is too low, there is the possibility that an influence is given to the operation of the memory circuit 10 supplied with the voltage Vdd. Therefore, in order to set the voltage Vdd0 to a low voltage such that no influence is given, the reference voltage REF is set to a suitable value.

As can be seen from the foregoing description, when the memory chip is in an active state, the voltage Vdd is set to the voltage Vdd1 while when it is in a standby state, the voltage Vdd steps down to the voltage Vdd0. Therefore, a cutoff current of transistors (nMOS transistor, pMOS transistor) of the sense amplifier circuit decreases; as a result, a standby current is reduced. When the memory chip is in a standby state, the operation of the first power step-down circuit 21 is stopped to prevent division resistance of R10 and R20 and to prevent a through current from flowing through a current mirror circuit in the first power step-down circuit 21. The relation of Vdd0<Vdd1, that is, the voltage Vdd of the standby stat is set lower than the Vdd of the active state. This is generally equivalent to the matter that the relation of (R1+RP)/(RN+R2)<R10/R20 is set.

In this case, there is a need to set the lower limit stepping down an internal power supply voltage Vdd in a standby state considering the following matter. Namely, it is important that the memory chip can execute a desired circuit operation for a period from a standby state to an active state.

The following effect will be described below. Namely, the effect means the difference between Vdd=Vdd0 in a standby state and Vdd=Vdd1 in an active state and the control that Vdd0 is set lower than Vdd1. The upper limit of the voltage Vdd0 is set to such a degree that a standby current is reduced to a desired current value, and different depending on the memory cell capacitance of products and process generation. In particular, the upper limit of the voltage Vdd0 depends on the number of sense amplifier circuits, the dimension and the number of transistors having a narrow width used for the sense amplifier. On the other hand, the lower limit of the voltage Vdd0 is determined from the time that the voltage Vdd is restorable from Vdd0 to Vdd1 for a period from a standby state to an active state. Namely, the lower limit of the voltage Vdd0 is different depending on a floor plan of products, in particular, the layout of a power step-down circuit. In view of the foregoing circumstances, it is desirable that the voltage Vdd0 is about 5% to 20% lower than Vdd1 as the target of Vdd1−Vdd0. According to a numerical value of the voltage Vdd0, it is desirable that $5/100 \leq (Vdd1-Vdd0)/Vdd1 \leq 20/100$, that is, $0.8 \leq Vdd0/Vdd1 \leq 0.95$.

In this case, there is a tendency for a standby current to be approximately proportional to the voltage of Vdd0. The standby current of a circuit supplied with the voltage Vdd0 decreases by the reduction of the voltage Vdd0. In particular, in a NAND flash memory, advance in the scale reduction is made, and thereby, a standby current of a sense amplifier in the memory circuit 10 increases in a ratio occupied by the total standby current. Therefore, when the memory chip is in a standby state, the voltage Vdd of a sense amplifier is reduced, and thereby, the effect is specially obtained.

As described above, according to this embodiment, the circuit operation of the internal step-down power generation circuit is set so that the relation of Vdd0<Vdd1 is established. In this way, it is possible to reduce a cutoff current of nMOS transistor or pMOS transistor in a standby state. Therefore, it is possible to greatly prevent the standby current even if the following case is given in a 70 nm-after design rule process generation NAND flash. Specifically, it is possible to greatly prevent the standby current even if a ratio a cutoff current of nMOS transistor or pMOS transistor of a sense amplifier gives an influence becomes high in a standby current. In this case, a range from 0.2 V to 0.5 V is effective as a target of the voltage Vdd1−Vdd0. If the voltage Vdd1−Vdd0 is less than 0.1 V is a range causing a circuit characteristic change resulting from manufacture.

(Modification Example of First Power Step-Down Circuit)

FIG. 4 shows a modification example of the first power step-down circuit 21 shown in FIG. 2. According to this modification example, a first power step-down circuit 21a differs from the first power step-down circuit 21 of the first embodiment in the following point. Namely, an output buffer circuit 32a is configured using an enhancement pMOS transistor and a depletion nMOS transistor in place of the output buffer circuit 32 of the first power step-down circuit 21 shown in FIG. 2. Specifically, the output buffer circuit 32a includes a pMOS transistor p3, a pMOS transistor p4, a capacitor C1, an nMOS transistor n7 and a capacitor C5. More specifically, the pMOS transistor p3 has a source terminal supplied with an external power supply voltage Vext of a Vext node and a gate terminal connected to an output node of the differential amplifier circuit 31. The pMOS transistor p4 has a source terminal supplied with an external power supply voltage Vext of a Vext node, a drain terminal connected to the gate terminal of the pMOS transistor p3 and a gate terminal supplied with an activation control signal /ENB. The capacitor C1 is connected between the gate terminal of the pMOS transistor p3 and the drain terminal thereof. The nMOS transistor n7 has a source terminal supplied with an external power supply voltage Vext of a Vext node, a gate terminal connected to the drain terminal of the pMOS transistor p3 and a drain terminal connected to an output node of Vdd. The capacitor C5 is connected between the gate terminal of the nMOS transistor n7 and a ground node.

Moreover, with a change of the circuit configuration of the output buffer circuit 32, a voltage division circuit 33 is changed to a voltage division circuit 33a. The voltage division circuit 33a includes a depletion nMOS transistor n6, a first resistance element R10, a second resistance element R20, an activation control nMOS transistor n5 and a capacitor C4. A drain/source path of the nMOS transistor n6, the first resistance element R10, the second resistance element R20 and a drain/source path of the activation control nMOS transistor n5 are connected in series between a Vext node and a ground node. The gate terminal of the nMOS transistor n6 is connected to the drain terminal of the pMOS transistor p3. The gate terminal of the activation control nMOS transistor n5 is supplied with the activation control signal /ENB. The capacitor C4 is connected between the drain terminal of the pMOS transistor p3 and a series-connected node of resistance elements R10, R20. A voltage of the series-connected node of resistance elements R10 and R20 is fed back to the non-inverted input terminal of the differential amplifier circuit 31 as the monitor voltage MON.

In the first power step-down circuit 21a having the foregoing configuration, the value of internal power supply voltage Vdd is determined by a division ratio of resistances R10 and R20. Therefore, resistances R10 and R20 are controlled so that the relation of Vdd1=(1+R10/R20)×REF is obtained. In this way, when a memory chip is in an active state, the voltage Vdd is fed back so that it matches with a target voltage Vdd1, that is, Vdd1={1+(R10/R20)}×REF.

(Modification Example of the First Embodiment)

FIG. 5 shows the internal configuration of a chip of a NAND flash memory according to a modification example of the first embodiment of the present invention. The first embodiment shows the case where the internal power supply voltage Vdd is one kind. On the contrary, according to this modification example, a chip is provided with a plurality of internal step-down power generation circuits 20a, 20b, . . . so that a plurality of internal power supply voltages Vdda, Vddb, . . . . The foregoing voltages Vdda, Vddb, . . . are supplied to different circuits 13a, 13b, . . . of a memory circuit 10, respectively. The internal step-down power generation circuits 20a, 20b, . . . each has the block configuration shown in FIG. 1, and further, has the circuit configuration shown in FIG. 2.

FIG. 6 shows the layout image of a capacitor connected to an internal power line of the internal step-down power generation circuits 20a, 20b, . . . of the circuit shown in FIG. 5. A plurality of interconnect lines 51 are equivalent to an internal power line 23. A plurality of interconnect lines 52 are equivalent to a ground voltage power line. These interconnects lines 51 and 52 are formed of a metal interconnect (M2), for example. The capacitor 24 includes an active region (AA) 53 of a semiconductor substrate and a gate conductor (GC) 54 formed on the active region 53 via a dielectric film. Interconnect lines 55 and 56 formed of a metal interconnect (M1) are formed to cross the foregoing interconnect lines 51 and 52. One interconnect line 55 is formed so that a connection is made between the interconnect lines 51 and the gate conductor 54. The other interconnect line 56 is formed so that a connection is made between the interconnect lines 52 and the active region 53. In this case, the active region 53 is connected to an interconnect line 57 formed of a metal interconnect (M0) via a plurality of contacts. The interconnect line 57 is connected to the interconnect line 56 via a contact 58. Likewise, the gate conductor 54 is connected to an interconnect line 57 formed of a metal interconnect (M0) via a plurality of contacts. The interconnect line 57 is connected to the interconnect line 55 via a contact 58. As can be seen from the foregoing description, the capacitor 24 includes a MOS capacitor.

Usually, the capacitor 24 is arrayed in a state of being dispersed on a circuit layout. Therefore, many capacitors having the foregoing configuration shown in FIG. 6 are arrayed on a chip in a dispersed state.

The foregoing interconnect lines and capacitor shown in FIG. 6 are given as one example; in this case, another structure such as a well capacitor may be applicable to the capacitor 24. Moreover, interconnect lines may be formed using a metal interconnect having the different number of layers.

<Second Embodiment>

FIG. 7 is a block diagram showing the internal configuration of a chip of a NAND flash memory according to a second embodiment of the present invention. A memory chip of the NAND flash memory is provided with nMOS and pMOS transistors, which are formed according to a 70 nm-or less design rule and isolated by an isolation region having a trench structure. The foregoing memory chip is formed with a memory circuit 10, a high-voltage generation circuit and an internal step-down power generation circuit 60.

The internal step-down power generation circuit 60 includes a first power step-down circuit 21, a second power step-down circuit 22, a third power step-down circuit 25, a capacitor 26 and a switch circuit 27. Each of the first, second and third power step-down circuit 21, 22, 25 has the same configuration as shown in FIG. 2. Specifically, the first power step-down circuit 21 outputs a first internal power supply voltage when a memory chip is in an active state. The second power step-down circuit 22 outputs a second internal power supply voltage lower than the first internal power supply voltage when the memory chip is in a standby state. The third power step-down circuit 25 outputs a third internal power supply voltage. Each output node of first and second power step-down circuit 21 and 22 is connected to an internal power line 23. The internal power line 23 is connected with a capacitor 24 as the necessity arises.

The third power step-down circuit 25 has the same circuit configuration as the first power step-down circuit shown in FIG. 2. The circuit 25 always outputs a third internal power supply voltage lower than the first and second power supply voltages. Therefore, in the third power step-down circuit 25, each gate terminal of transistors n4, p5 and n5 shown in FIG. 2 is supplied with an external power supply voltage Vext in place of the activation control signal /ENB.

Further, in the circuit 25, the value of resistance of resistors R10 and R20 is controlled so that an internal power supply voltage Vdd2 lower than Vdd1 and Vdd0 is generated in an output node of Vdd. The switch circuit 27 includes a pMOS transistor p60. The pMOS transistor p60 has a source/drain path, which is connected between a Vdd output node of the third power step-down circuit 25 and a Vdd output node of first and second power step-down circuits 21, 22. Further, the pMOS transistor p60 has a gate terminal supplied with an activation control signal ENB.

The operation of the circuit shown in FIG. 7 will be described below with reference to FIG. 8. FIG. 8 shows the activation control signal ENB and a waveform of an output node of an internal power supply voltage Vdd in the circuit shown in FIG. 7. In the circuit having the foregoing configuration shown in FIG. 7, the third power step-down circuit 25 always outputs a third internal power supply voltage Vdd2 when a memory chip is powered on regardless of a standby state and an active state. The capacitor 26 is charged by the third internal power supply voltage Vdd2.

When a memory chip transfers from a standby state to an active state, the pMOS transistor p60 turns on so that the switch circuit 27 is conducted. Charges previously charged in the capacitor 26 flows into the capacitor 24, and then, charge share occurs; as a result, the voltage of the internal power line 23 instantaneously steps up. In an active state, the first power step-down circuit 21 is operated, and then, charges are replenished with an output voltage Vdd1 of the first power step-down circuit 21 by the shortage to a target voltage.

According to this embodiment, in a standby state, the low internal power supply voltage Vdd0 output from the second power step-down circuit 22 to supplied to the memory circuit 10. Therefore, it is possible to reduce a cutoff current of nMOS or pMOS transistor in the memory circuit 10 in the standby-state. In addition, according to this embodiment, the internal step-down power generation circuit 60 is additionally provided with the foregoing third power step-down circuit 25, capacitor 26 and switch circuit 27. The capacitor 26 is charged by the output voltage of the third power step-down circuit 25 for the period of a standby state. Further, charge share occurs between capacitors 26 and 24 when the memory circuit transfers to an active state so that the first power step-down circuit 21 is operated, and thereby, the voltage of the internal power line 23 is stepped up at high speed. In this way, the output voltage Vdd0 of the second power step-down circuit 22, which is operated for a standby state, is further stepped down. As a result, it is possible to further reduce a cutoff current of nMOS or pMOS transistor in the memory circuit 10 at the standby-state, compared with the first embodiment.

According to this embodiment, the capacitance of the capacitor 24 is set smaller than that of the capacitor 26. Therefore, the voltage of the internal power line 23 is stepped up at high speed by charge share occurring when the memory circuit transfers from a standby state to an active state.

In this embodiment, the following modification may be made like the modification example circuit shown in FIG. 5. Specifically, as shown in FIG. 9, a chip is provided with a plurality of internal step-down power generation circuits 60a, 60b, . . . so that a plurality of internal power supply voltages Vdda, Vddb, . . . . The foregoing internal power supply voltages Vdda, Vddb, . . . generated by the internal step-down power generation circuits 60a, 60b, . . . may be supplied to different circuits 13a, 13b, . . . of the memory circuit 10.

FIG. 10 shows an layout image of interconnect lines in the internal step-down power generation circuits 60a, 60b, . . . of the circuit shown in FIG. 9, capacitors 24, 26 and a pMOS transistor forming a switch circuit. An interconnect line 61 is equivalent to an internal power line connected to an output node of the third power step-down circuit 25. An interconnect line 62 is equivalent to an internal power line 23 connected in common to each output node of first and second power step-down circuits 21 and 22. A plurality of interconnect lines 63 is equivalent to a ground voltage power line. These interconnect lines 61 to 63 are formed of a metal interconnect (M2), for example. The capacitor 24 includes an activation area (AA) 53 of a semiconductor substrate and a gate conductor (GC) 54 formed on the activation area 53 via a dielectric film. The capacitor 26 includes an activation area (AA) 64 of a semiconductor substrate and a gate conductor (GC) 65 formed on the activation area 64 via a dielectric film. Interconnect lines 66 to 68 formed of a metal interconnect (M1) are formed to cross the foregoing interconnect lines 61 to 63. The interconnect line 62 and the gate conductor 54 are connected by means of the interconnect line 66. The interconnect line 61 and the gate conductor 65 are connected by means of the interconnect line 67. The interconnect lines 63 and two activation areas 53, 64 are connected by means of the interconnect line 68. Activation areas 53 and 64 are connected to the interconnect line 69 formed of a metal interconnect (M0) via a plurality of contacts. The interconnect line 69 is connected to the interconnect line 68 via a contact 70. The gate conductor 54 is connected to an interconnect line 71 formed of a metal interconnect (M0) via a plurality of contacts. The interconnect line 71 is connected to the interconnect line 66 via a contact 72. The gate conductor 65 is connected to an interconnect line 73 formed of a metal interconnect (M0) via a plurality of contacts. The interconnect line 73 is connected to the interconnect line 67 via a contact 74.

In FIG. 10, a reference numeral 80 denotes an n-well region formed with a pMOS transistor 60 forming the switch circuit 27. The n-well region 80 is formed with a plurality of p-type diffusion regions 81 forming a source/drain region of the pMOS transistor p60 and an n-contact region 82. A plurality of gate conductors 83 is formed between p-type diffusion regions 81 in a state of being dispersed on the region. The foregoing interconnect lines 66 and 67 are extended onto the n-well region 80. The interconnect line 66 is connected to the alternate p-type diffusion region 81 in the regions 81 via a contact. The interconnect line 67 is connected to the alternate p-type diffusion region 81, which is not connected to the interconnect line 66, in the regions 81 via a contact. Further, the interconnect line 67 is connected to the n-contact region 82 via a contact. A plurality of gate conductors 83 is connected in common to an interconnect line 84 formed of a metal interconnect (M2), for example. The interconnect line 84 is supplied with an activation control signal ENB. As can be seen from the foregoing description, the pMOS transistor p60 includes a plurality of transistors.

The foregoing interconnect lines and capacitors shown in FIG. 10 are given as one example; in this case, another structure such as a well capacitor may be used as the capacitor. The interconnect line may be formed using a metal interconnect having the different number of layers.

Figure 11:
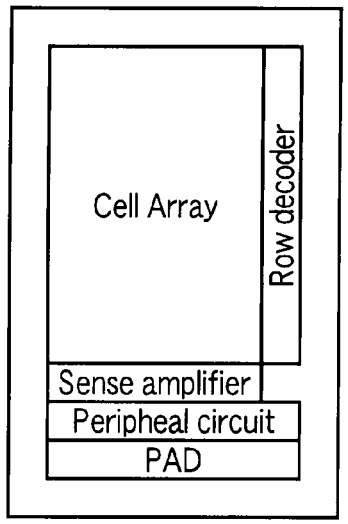
FIG. 11 is a top plan view showing one example of a chip floor plan of a NAND flash memory according to first and second embodiments of the present invention.
Figure 12:
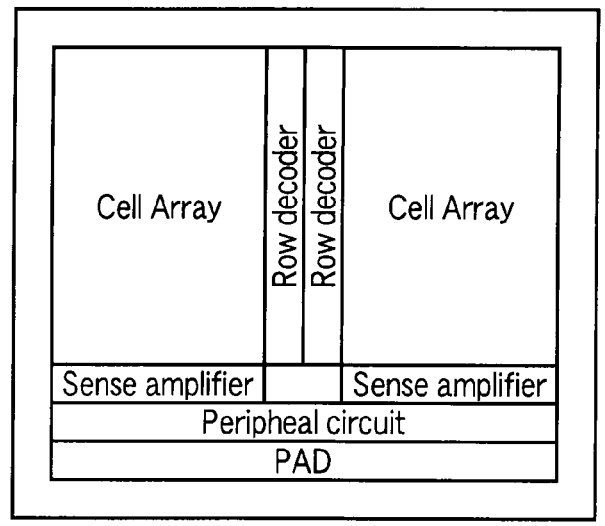
FIG. 12 is a top plan view showing another example of a chip floor plan of a NAND flash memory according to first and second embodiments of the present invention.
Figure 13:
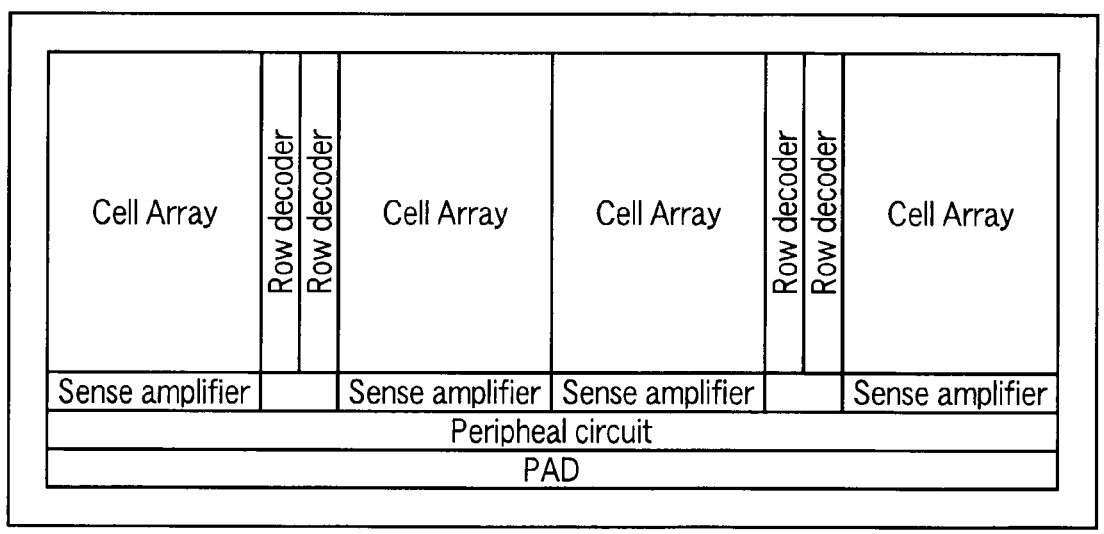
FIG. 13 is a top plan view showing still another example of a chip floor plan of a NAND flash memory according to first and second embodiments of the present invention.

FIGS. 11 to 13 show various examples of the chip floor plan of a NAND flash memory according to first and second embodiments of the present invention. FIG. 11 shows an example in which a cell array is one plane. FIG. 12 shows an example in which a cell array is two planes. FIG. 13 shows an example in which a cell array is four planes. The internal step-down power generation circuit 20 or 60 and the high-voltage generation circuit shown in FIG. 1 or FIG. 7 are formed in the peripheral circuit of FIGS. 11 to 13. Even if the arrangement of cell array, row decoder and sense amplifier is different from these drawings, the same effect is obtained. The layout images shown in FIGS. 6 and 10 show the layout image of a peripheral circuit in the chip floor plan of the NAND flash memory shown in FIGS. 11 to 13. In the peripheral circuit, usually, it is desirable that interconnect lines are formed so that the extended direction of a metal interconnect (M2) becomes horizontal in FIGS. 11 to 13.

According to the modification examples of first and second embodiments shown in FIGS. 5 and 9, the chip is provided with a plurality of internal step-down power generation circuits. In this case, a plurality of internal power supply voltages generated by the internal step-down power generation circuits may be supplied to a sense amplifier and a row decoder. Or, the peripheral circuit may be divided into a plurality of circuit parts so that the voltages are supplied to these circuit parts. The power supply voltage of the peripheral circuit depends on a voltage of various circuits. For example, it is desirable that the power supply voltage of a logic circuit is low considering a reduction of current consumption. Conversely, the power supply voltage is high, and thereby, operation margin is easy to be secured in a circuit having a critical path requiring an operation speed and an analog circuit such as a current mirror circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   at least one internal step-down power generation circuit configured to generate a first internal power supply voltage from an external power supply voltage in an active state, and generate a second internal power supply voltage different from the first internal power supply voltage from the external power supply voltage in a standby state; and
   a memory circuit including a cell array containing a nonvolatile memory cell and a sense amplifier detecting data read from the cell array, and supplied with a voltage generated by said at least one internal step-down power generation circuit as an internal power supply voltage,
   wherein said at least one internal step-down power generation circuit includes a plurality of internal step-down power generation circuits.

2. The device according to claim 1, wherein the voltage generated by said at least one internal step-down power generation circuit is supplied to the sense amplifier of the memory circuit as a power supply voltage.

3. The device according to claim 1, further comprising:
   a capacitor connected to an output node of said at least one internal step-down power generation circuit.

4. The device according to claim 1, further comprising:
   a plurality of capacitors connected to each output node of the internal step-down power generation circuits.

5. The device according to claim 1, wherein the first internal power supply voltage is set as Vdd1 and the second internal power supply voltage is set as Vdd0, said at least one internal step-down power generation circuit generates the first and second internal power supply voltages to satisfy a condition of $0.8 \leq Vdd0/Vdd1 \leq 0.95$.

6. The device according to claim 1, wherein the first internal power supply voltage is set as Vdd1 and the second internal power supply voltage is set as Vdd0, said at least one internal step-down power generation circuit generates the first and second internal power supply voltages that Vdd1-Vdd0 is set to a range from 0.2 V to 0.5 V.

7. The device according to claim 1, wherein said at least one internal step-down power generation circuit includes:
   a first power step-down circuit operating in an active state to generate the first internal power supply voltage from the external power supply voltage; and
   a second power step-down circuit operating in a standby state to generate the second internal power supply voltage from the external power supply voltage.

8. The device according to claim 7, wherein the first power step-down circuit includes:
   a division circuit dividing a voltage of an output node of the first internal power supply voltage at a predetermined ratio to output a first division voltage;
   a differential amplifier circuit receiving the division voltage to compare it with a reference voltage, and outputting a comparison signal corresponding to the comparison result; and
   an output buffer circuit having a first transistor including a current path and a gate terminal, the current path being inserted between a supply node of the external power supply voltage and an output node of the first internal power supply voltage, and the gate terminal being supplied with the comparison signal.

9. The device according to claim 7, wherein the second power step-down circuit includes:

a division circuit dividing a voltage of an output node of the second internal power supply voltage at a predetermined ratio, and outputting a first division voltage and a second division voltage lower than the first division voltage;

a first differential amplifier circuit receiving the first division voltage to compare it with a reference voltage, and outputting a first comparison signal corresponding to the comparison result;

a second differential amplifier circuit receiving the second division voltage to compare it with the reference voltage, and outputting a second comparison signal corresponding to the comparison result; and an output buffer circuit including: a first transistor having a current path and a gate terminal, the current path being inserted between a supply node of the external power supply voltage and an output node of the second internal power supply voltage and the gate terminal being supplied with the first comparison signal; and a second transistor having a current path and a gate terminal, the current path being inserted between an output node of the second internal power supply voltage and a supply node of a ground voltage and the gate terminal being supplied with the second comparison signal.

10. A nonvolatile semiconductor memory device comprising:

at least one internal step-down power generation circuit configured to generate a first internal power supply voltage from an external power supply voltage in an active state, and generate a second internal power supply voltage different from the first internal power supply voltage from the external power supply voltage in a standby state; and a memory circuit including a cell array containing a nonvolatile memory cell and a sense amplifier detecting data read from the cell array, and supplied with a voltage generated by said at least one internal step-down power generation circuit as an internal power supply voltage, wherein said at least internal step-down power generation circuit includes:

a first power step-down circuit having a first output node, and generating the first internal power supply voltage from an external power supply voltage in the first output node in an active state;

a second power step-down circuit having a second output node connected to the first output node, and generating the second internal power supply voltage from an external power supply voltage in the second output node in a standby state;

a third power step-down circuit having a third output node, and always outputting a third internal power supply voltage from an external power supply voltage in the third output node;

a first capacitor connected to the third output node; and a switch circuit connected between the first and second output nodes and the third output node, and being conductive for a period of the active state while being nonconductive for a period of the standby state.

11. The device according to claim 10, wherein the voltage generated by said at least one internal step-down power generation circuit is supplied to the sense amplifier of the memory circuit as an internal power supply voltage.

12. The device according to claim 10, wherein said at least one internal step-down power generation circuit includes a plurality of internal step-down power generation circuits.

13. The device according to claim 10, wherein the third internal power supply voltage is lower than the first and second internal power supply voltages.

14. The device according to claim 10, further comprising:
a second capacitor connected to the first and second output nodes.

15. The device according to claim 14, wherein the second capacitor has a capacitance smaller than the first capacitor.

16. The device according to claim 10, wherein the switch circuit includes a plurality of transistors connected in parallel.

17. The device according to claim 10, wherein the first power step-down circuit includes:

a division circuit dividing a voltage of the first output node at a predetermined ratio to output a division voltage;

a differential amplifier circuit receiving the division voltage to compare it with a reference voltage, and outputting a comparison signal corresponding to the comparison result; and an output buffer circuit including a first transistor having a current path and a gate terminal, the current path being inserted between a supply node of the external power supply voltage and an output node of the first internal power supply voltage, and the gate terminal being supplied with the comparison signal.

18. The device according to claim 10, wherein the second power step-down circuit includes:

a division circuit dividing a voltage of the second output node at a predetermined ratio, and outputting a first division voltage and a second division voltage lower than the first division voltage;

a first differential amplifier circuit receiving the first division voltage to compare it with a reference voltage, and outputting a first comparison signal corresponding to the comparison result;

a second differential amplifier circuit receiving the second division voltage to compare it with the reference voltage, and outputting a second comparison signal corresponding to the comparison result; and an output buffer circuit including: a first transistor having a current path and a gate terminal, the current path being inserted between a supply node of the external power supply voltage and the second output node and the gate terminal being supplied with the first comparison signal; and a second transistor having a current path and a gate terminal, the current path being inserted between the second output node and a supply node of a ground voltage and the gate terminal being supplied with the second comparison signal.

19. The device according to claim 10, wherein the third power step-down circuit includes:

a division circuit dividing a voltage of the third output node at a predetermined ratio, and outputting a division voltage;

a differential amplifier circuit receiving the division voltage to compare it with a reference voltage, and outputting a comparison signal corresponding to the comparison result; and an output buffer circuit including a transistor having a current path and a gate terminal, the current path being inserted between a supply node of the external power supply voltage and the third output node and the gate terminal being supplied with the comparison signal.

20. The device according to claim 5, wherein the first and second internal power supply voltages satisfy the condition in the standby state.

21. The device according to claim 6, wherein the first and second internal power supply voltages are set to the range in the standby state.

* * * * *